(12) United States Patent
Kwok et al.

(10) Patent No.: US 9,112,109 B2
(45) Date of Patent: Aug. 18, 2015

(54) THERMOELECTRIC GENERATOR ASSEMBLY AND SYSTEM

(75) Inventors: David W. Kwok, La Mirada, CA (US); Jack W. Mauldin, Long Beach, CA (US); James P. Huang, Huntington Beach, CA (US); Namsoo P. Kim, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 1287 days.

(21) Appl. No.: 12/613,897

(22) Filed: Nov. 6, 2009

(65) Prior Publication Data

US 2011/0108080 A1      May 12, 2011

(51) Int. Cl.
*H01L 35/32* (2006.01)
*H01L 35/10* (2006.01)

(52) U.S. Cl.
CPC .............. *H01L 35/32* (2013.01); *H01L 35/10* (2013.01)

(58) Field of Classification Search
CPC ............................... H01L 35/32; H01L 35/00
USPC ......................................................... 136/205
See application file for complete search history.

(56) References Cited

U.S. PATENT DOCUMENTS

| | | | |
|---|---|---|---|
| 3,290,177 A | | 12/1966 | Mole et al. |
| 3,726,100 A | * | 4/1973 | Widakowich ..................... 62/3.2 |
| 3,899,359 A | * | 8/1975 | Stachurski ..................... 136/205 |
| 4,233,085 A | * | 11/1980 | Roderick et al. ............. 136/244 |
| 4,513,167 A | * | 4/1985 | Brandstetter ................. 136/244 |
| 6,787,691 B2 | | 9/2004 | Fleurial et al. |
| 7,360,365 B2 | | 4/2008 | Codecasa et al. |
| 2006/0042675 A1 | * | 3/2006 | Tateyama et al. ............. 136/212 |
| 2007/0221264 A1 | * | 9/2007 | Shutoh et al. ................ 136/224 |
| 2008/0000511 A1 | * | 1/2008 | Kuroyanagi et al. ......... 136/201 |
| 2009/0120482 A1 | | 5/2009 | McCullough et al. |
| 2009/0159110 A1 | | 6/2009 | Kwok et al. |

FOREIGN PATENT DOCUMENTS

| | | |
|---|---|---|
| DE | 10200407 A1 | 7/2003 |
| JP | 09172203 | 6/1997 |

(Continued)

OTHER PUBLICATIONS

Insulating. Dictionary.com Unabridged. Random House, Inc. May 9, 2013. <Dictionary.com http://dictionary.reference.com/browse/INSULATING>.*

(Continued)

*Primary Examiner* — Shannon Gardner
(74) *Attorney, Agent, or Firm* — Charles L. Moore; Moore & Van Allen PLLC

(57) ABSTRACT

A thermoelectric generator assembly may comprise a frame that may include a first frame member and a second frame member. The first frame member and the second frame member are adapted to retain one or more thermoelectric generator devices in position therebetween for transferring heat energy through the one or more thermoelectric generator devices from a heat source to a heat sink to generate electrical energy. The thermoelectric generator assembly may also include a spacer positioned between the first frame member and the second frame member. A power bus may be included to provide the electrical energy generated by the one or more thermoelectric generator devices for powering an electrical device.

28 Claims, 8 Drawing Sheets

(56) References Cited

FOREIGN PATENT DOCUMENTS

| | | | |
|---|---|---|---|
| JP | 2001165525 | | 6/2001 |
| WO | 8504948 | A1 | 11/1985 |
| WO | 02086980 | A1 | 10/2002 |
| WO | 03071198 | A1 | 8/2003 |
| WO | 2004054007 | A2 | 6/2004 |

OTHER PUBLICATIONS

European Patent Office, PCT International Search Report and Written Opinion of the International Searching Authority for International Application No. PCT/US2010/05114 dated Feb. 18, 2011.

* cited by examiner

THERMOELECTRIC GENERATOR ASSEMBLY AND SYSTEM

FIELD

The present disclosure relates to devices and systems for generating electrical power, and more particularly to a thermoelectric generator assembly and system.

BACKGROUND

A thermoelectric generator (TEG) is a device that can generate electricity when a temperature differential is applied across the device. One example of a TEG device is a thermal semiconductor chip, such as those manufactured by ENECO, Inc. of Salt Lake City, Utah. A TEG device is typically square or rectangular with the upper and lower end-caps having the same dimension and typically power generated by TEGs is transmitted via a set of power wires. TEG devices are typically thin (e.g., in the order of a couple of millimeters thick), small (e.g., a couple of square centimeters), flat, and brittle. Accordingly, TEG devices can be difficult to handle individually, especially for applications in vehicles, such as automobiles, aircraft and the like, where the TEG devices can be subject to harsh environmental conditions, such as vibration, constant temperature variations and other harsh conditions. Because of their size and the fact that each TEG device generates only a small amount of power, many TEG devices are bundled together in order to generate a useful amount of power. Further, TEG devices generally provide greater energy conversion efficiency at high temperature. This can cause relatively large thermal expansion in materials. Because of thermal gradients and different thermal coefficients of expansion associated with different materials, thermally induced stresses may result.

Efficiency of TEG devices generally increases with greater temperature differentials, i.e., delta temperature between two opposite sides, typically called the heat source (hot side) and heat sink (cold side) of the TEG device. Also, energy conversion efficiency is maximized for any installation that channels heat flow through the TEG devices only without any thermal energy leaks through the surrounding structural material or gaps. Thus, to simplify handling and achieve high performance in converting heat to electricity, multiple TEG devices can be encased into a module or assembly prior to final installation. FIG. 1 is an illustration of an exemplary prior art thermoelectric generator assembly 100 or module. TEG devices 102 are sandwiched between two structural plates 104 and 106. Each of the two structural plates 104 and 106 may be made of a thermally conductive material, such as copper or Aluminum Nitride (AlN), to spread the heat on both hot and cold sides of the TEG module 100. One of the plates, such as upper structural plate 104 may define a cold spreader plate and may be thermally coupled to a cold side 108 of each of the TEG devices 102. The other plate, such as the lower structural plate 106 may define a hot spreader plate and be coupled to a hot side 110 of each of the TEG devices 102. Each of the plates 104 and 106 may be respectively thermally coupled to the cold side 108 and hot side 110 of each of the TEG devices 102 by a brazed interface 112 and 114. Vacuum gaps 116 or insulation material may be used to separate each TEG device 102 in the module 100 to maximize heat flow through TEGs 102. Additional insulation may be required to prevent heat losses through the sides.

FIG. 2 is an illustration of a cross-sectional view of a prior art thermoelectric generator (TEG) module 200 for installation in an aircraft engine compartment or similar apparatus for generation of electrical energy. The TEG module 200 may also be referred to as an Extended Mission through Energy Conversion (EMTEC) module. Heat energy 202 may be received from a heat source 204, such as an interior of a gas turbine engine of an airplane. The heat energy 202 is received by a thermal interface or heat spreading plate 206 similar to that previously described which may be made of a material such as copper, aluminum nitride (AlN) or similar heat conductive material. The thermal interface or heat spreading plate 206 may be thermally connected to the TEG device 208 by brazing or by some other means to provide a negligible resistance to the transfer of thermal energy to the TEG 208. In this installation approach, portions of insulation material 210 and 212 may be used to fill the gaps between adjacent EMTEC modules to prevent heat escaping through the space between the modules. Another portion of insulation material 214 may also be disposed on each edge of the TEG 208 for efficient transfer of heat energy through the TEG 208 for generation of electricity. A cold side interface 216 or cold spreader plate similar to that previously described may be thermally coupled to the cold side of the TEG 208. Both the EMTEC module 200 and insulation material are attached to a stress buffer layer 218 which is attached to a cold sink 220 or heat sink. A stress buffer layer may also be used on the hot source as well. The stress buffer layer 218 acts as an absorption layer for thermal expansion mismatch induced stress and vibration. Such a "bridge" material between two materials that are incompatible in regards to coefficient of thermal expansion (CTE) is typically selected to have a CTE in between those of the two incompatible materials. Installation of the EMTEC module 200 to the cold sink 220, for example, the exterior wall of an aircraft engine compartment can be accomplished by various means, e.g., mechanical means by attaching insulation and the stress buffer layers 218 to the cold sink 220 or the engine compartment wall with bolts, etc. and bonding means by attaching EMTEC modules 200 to the stress buffer 218 using thermal grease, soldering, or brazing for high temperature application.

Each EMTEC module 200 needs to be individually attached or adhered to the insulation material or stress buffer layer 218. This is a labor intensive operation and adds cost to manufacturing. Additionally, brazing TEGs is a delicate process and damage during manufacturing can often occur. Because more power is generated when TEGs are installed in locations with the greatest temperature differentials, TEG devices are potentially subjected to high temperature. To avoid thermal stresses generated by uneven thermal expansion between TEGs and the structural material, the structural material is chosen based on its thermal expansion quality over its thermal conductivity. Less than desirable thermally conductive material leads to reduced power generation. For units that are installed in a system where periodic variations in temperature are common, such as an engine, thermal expansion for each material becomes a significant design challenge.

Each layer of material in the thermal path from the hot side to the cold side of a TEG module, such as module 200, adds thermal resistance to the overall thermal stack. Increased thermal resistance reduces effective temperature differential across the TEG, and loss of energy conversion efficiency can result. More layers in the thermal path of the TEGs results in higher thermal resistance, which in turn reduces the overall system efficiency.

Another drawback for some applications is that EMTEC modules are flat. The surface of the high temperature source may not be flat. For example, the surface of an aircraft turbo engine is cylindrical and the diameter of the cylinder varies along its length.

SUMMARY

In accordance with an embodiment, a thermoelectric generator assembly may comprise a frame that may include a first frame member and a second frame member. The first frame member and the second frame member are adapted to retain one or more thermoelectric generator devices in position therebetween for transferring heat energy through the one or more thermoelectric generator devices from a heat source to a heat sink to generate electrical energy. The thermoelectric generator assembly may also include a spacer positioned between the first frame member and the second frame member. A power bus may be included to provide the electrical energy generated by the one or more thermoelectric generator devices for powering an electrical device.

In accordance with another embodiment, a thermoelectric generator assembly may include a thermoelectric generator device and a frame adapted to hold the thermoelectric device. A ledge associated with the thermoelectric generator device extends beyond a periphery of the thermoelectric device. The ledge is adapted for mounting the thermoelectric device in the frame.

In accordance with another embodiment, a thermoelectric generator assembly may include a thermoelectric generator device and a frame adapted to hold the thermoelectric device. A slip joint may be formed to permit the thermoelectric generator device and the frame to expand and contract relative to one another when exposed to varying temperature levels or when the thermoelectric generator device and the frame have different coefficients of thermal expansion.

In accordance with another embodiment, a thermoelectric generator device may include a main body and a ledge extending a predetermined distance beyond a periphery of the main body of the thermoelectric generator device.

Other aspects and features of the present disclosure, as defined solely by the claims, will become apparent to those ordinarily skilled in the art upon review of the following non-limited detailed description of the disclosure in conjunction with the accompanying figures.

BRIEF DESCRIPTION OF THE SEVERAL VIEWS OF THE DRAWINGS

The following detailed description of embodiments refers to the accompanying drawings, which illustrate specific embodiments of the disclosure. Other embodiments having different structures and operations do not depart from the scope of the present disclosure.

DESCRIPTION

The following detailed description of embodiments refers to the accompanying drawings, which illustrate specific embodiments of the disclosure. Other embodiments having different structures and operations do not depart from the scope of the present disclosure.

Figure 3:
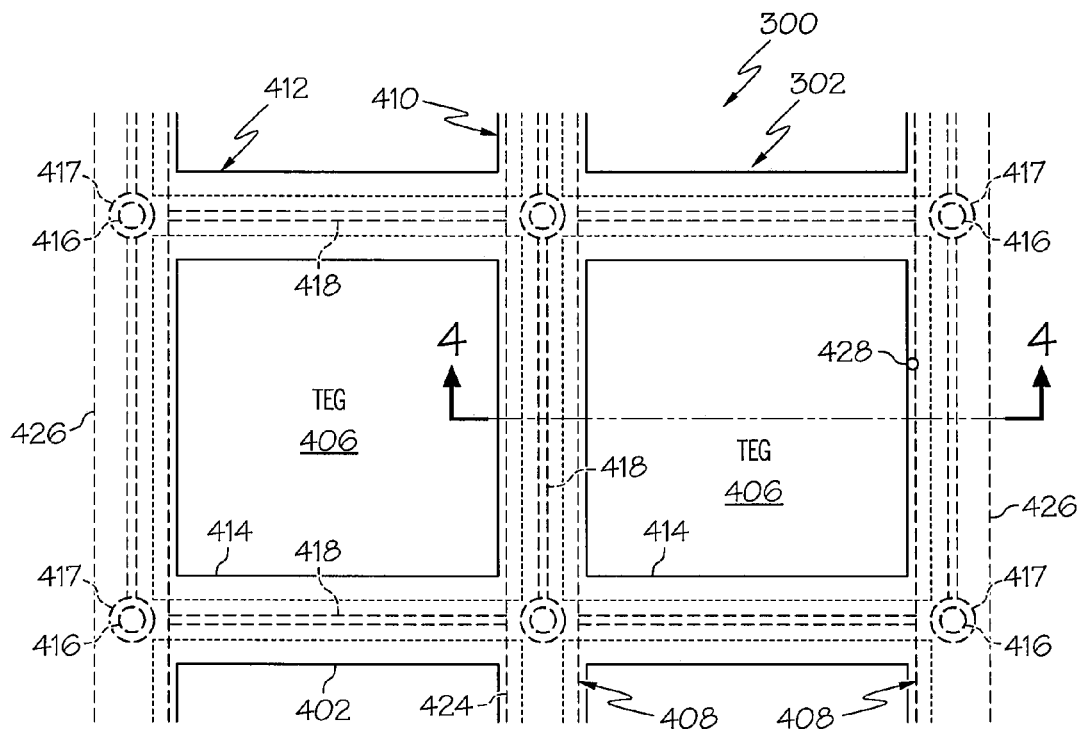
FIG. 3 is a top view of an example of a thermoelectric generator assembly in accordance with an embodiment of the present disclosure.
Figure 4A:
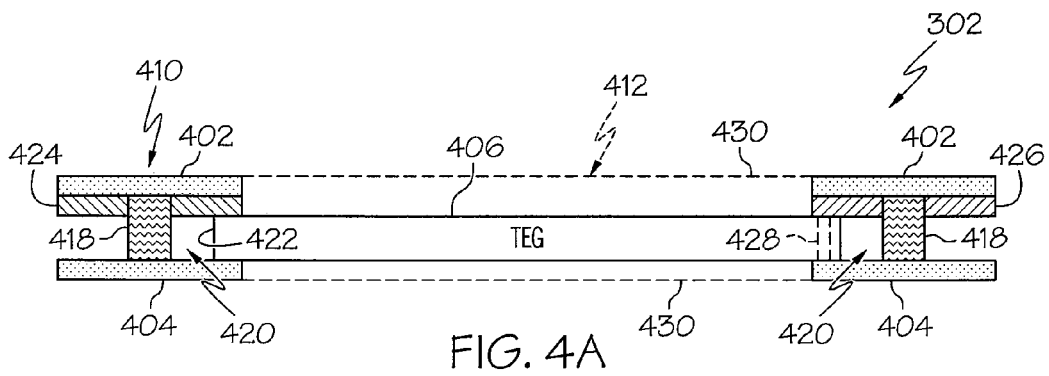
FIG. 4A is a cross-sectional view of the example of the thermoelectric generator assembly of FIG. 3 taken along lines 4-4 in accordance with an embodiment of the present disclosure.

FIG. 3 is a top view of an example of a thermoelectric generator (TEG) assembly 300 or module in accordance with an embodiment of the present disclosure. The thermoelectric generator assembly 300 may include a frame 302. Referring also to FIG. 4A, FIG. 4A is a cross-sectional view of the example of the thermoelectric generator assembly 300 of FIG. 3 taken along lines 4-4 in accordance with an embodiment of the present disclosure. The frame 302 may include a first frame member 402 or upper frame member and a second frame member 404 or lower frame member. Only the first frame member 402 or upper frame member is seen in FIG. 3. As described in more detail herein, the first frame member 402 and the second frame member 404 are adapted to retain one or more thermoelectric generator (TEG) devices 406 in position between the first frame member 402 and the second frame member 404 for transferring heat energy by the one or more TEG devices 406 from a heat source (not shown in FIGS. 3 and 4A) to a heat sink (not shown in FIGS. 3 and 4A) to generate electrical energy.

The first frame member 402 and the second frame member 404 are the primary structure used to hold the TEG module assembly 300 together. The first frame member 402 and the second frame member 404 may be adapted to substantially clamp the TEG device 406 or a portion of the TEG device 406, such as a ledge portion as described in more detail herein, between the frame members 402 and 404 to retain the TEG devices 406 in position. The frame members 402 and 404 also provide structural strength to the entire assembly. Both frames 402 and 404 may be made of thermally and electrically insulating materials. For some applications the first and second frame members 402 and 404 may be designed to meet other design constrains, such as weight or volume, and thermal and/or electrical insulating materials may not be chosen for the primary structure of the frame 302. For such designs where the first and second frame members 402 and 404 may not be made from a material that is a thermal and electrical insulation material, an electrical insulator layer is needed to isolate a power bus 408 from an electrically conductive frame and a thermal insulator is also potentially needed to eliminate parasitic thermal energy loss through a thermally conductive frame.

The first and second frame members 402 and 404 may be formed in a lattice structure or matrix structure with vertical and horizontal intersecting segments 410 and 412 similar to that illustrated in FIG. 3. The vertical and horizontal intersecting segments 410 and 412 may form substantially square or rectangular openings 414. The size and shape of the openings 414 may correspond substantially to the size and shape of the TEGs 406 to be mounted and retained in the frame 302. The cold and hot sides of the TEG 406 are exposed through the openings 414 for contacting or being thermally coupled to a heat source and a heat sink or cold sink for generating electrical power or energy similar to that previously described. While the TEG assembly 300 and frame 302 are described herein as being substantially square or rectangular, other shapes may be used as well, such as circular, oval, elliptical, polygonal, etc. depending upon the shape of the TEGs being used and the particular application.

Fasteners 416 may be used to secure together the first frame member 402 and the second frame member 404. In the exemplary embodiment illustrated in FIG. 3, where the frame members 402 and 404 are shown as being substantially square or rectangular, the frame members 402 and 404 may be attached to each other proximate to the four corners of each TEG 406, although other fastener arrangements may also be used. For example, the fasteners 416 may be regularly spaced along the frame members 402 and 404 or may be located according to a predetermined pattern depending upon the application and nature or configuration of the surfaces to which the TEG assembly 300 may be attached. The fasteners 416 may also be used to secure the frame 302 to the surfaces of heat source (hot side) and heat sink (cold side). The fasteners 416 may be screws, bolts, snap together fasteners, a combination of these or any sort of means for attaching the frame member 402 and 404 to one another. The fasteners 416 may be removable fasteners for maintenance, such as for example TEG replacement due to failure or upgrade. Alternatively, permanent fasteners may be utilized. Certain types of fasteners, such as snap together fasteners, may be an integral part of one of the first or upper frame member 402 or the second or lower frame member 404. This may reduce manufacturing costs. The fasteners 416 may also be made of an electrically and thermally insulating material. Otherwise, the fasteners 416 will need to be isolated or sealed so that they don't become the sources of parasitic thermal paths or electrical shorting.

For applications where the first and second frame members 402 and 404 may need to be made from different materials with different coefficient of thermal expansion (CTE) and for applications where the same material is used in both frame member 402 and 404 and because of the difference in temperature exposure, thermal stress may result. To relieve this thermal stress, the fastener holes 417 in one of the frame member 402 and 404 may be enlarged or slotted to relieve thermal stress between the frame members 402 and 404.

The TEG assembly 300 or module may also include a spacer 418 positioned between the first frame member 402 and the second frame member 404 as shown in FIG. 4A. A slip joint 420 is formed by the first and second frame members 402 and 404, a side edge 422 of the TEG device 406, and the spacer 418. The slip joint 420 is adapted to permit or to provide a means for the TEG device 406 and the frame 302 to expand and contract independently from one another when they are exposed to varying temperature levels or when they have different coefficients of thermal expansion (CTE). The spacer 418 is positioned between the frames members 402 and 404 to create a space or gap between the frames members 402 and 404. The function of the spacer 418 is to provide a means for movement in the slip joint 420 between the TEGs 406 and the frame members 402 and 404. The spacer 418 may have a predetermined height or thickness to take into account thermal expansion and manufacturing tolerances of the TEG 406, spacer 418, the fastener 416, and frame materials. The spacer 418 may be sized to maintain a substantially tight but movable slip joint 420 over the operating temperature range of the TEG module 406. The proper thickness of the spacer 418 may provide a predetermined space or gap for TEG expansion within the frame 302 without creating parasitic thermal paths between the hot and cold sides of the TEG 406.

Figure 1:
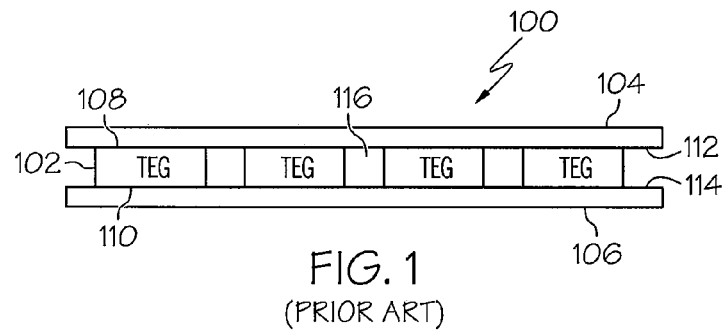
FIG. 1 is an illustration of an exemplary prior art thermoelectric generator assembly.
Figure 2:
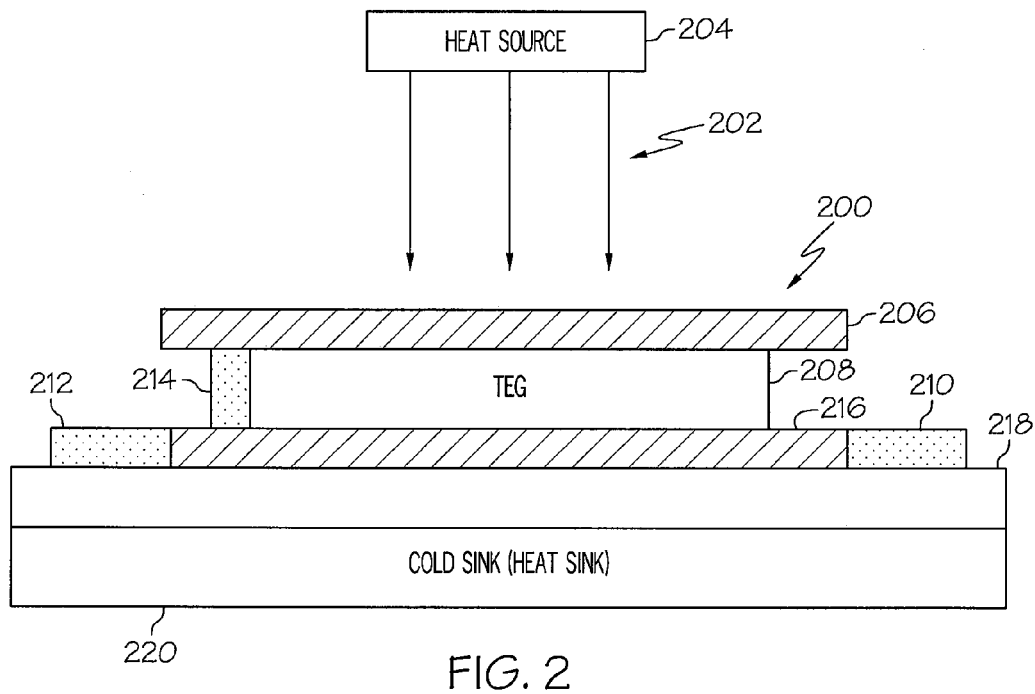
FIG. 2 is an illustration of a cross-sectional view of a prior art thermoelectric generator (TEG) module for installation in an aircraft engine compartment or similar apparatus for generation of electrical energy.

The use of the slip joint 420 may eliminate the need for a separate thermal stress relief buffer layer, such as stress relief buffer layer 218 in FIG. 2. System integration and installation without the stress relieve buffer layer is much simpler.

The spacer 418 may be an independent part from the frame 302 to allow different TEGs 406 with different thicknesses to be integrated in a single frame or to permit a common frame design, structure, or size to be usable for multiple different thicknesses of TEGs 406. Alternatively, the spacer 418 may be an integral part of the frame 302 to reduce manufacturing complexity. The spacer 418 may be integrally formed as part of either the first frame member 402 or the second frame member 404.

The spacer 418 may extend or run substantially the entire length of the frame 302 between fasteners 416 or may extend only partially the length between fasteners 416. For some applications, functions of the spacers 418 and fasteners 416 may be combined into a combination spacer-fastener arrangement, for example a snap together fastener with a larger mid-section.

The thermoelectric generator assembly 300 may also include a power bus 408 to provide the electrical energy generated by the one or more TEG devices 406 for powering an electrical device. Power or electrical energy from the TEG devices 406 may be transmitted from contacts formed on each TEG device 406 to the power buses 408 in the frame 302. Different contact arrangements for the TEG devices 406 will be described in more detail with reference to FIGS. 5A, 5B, 6A, 6B, 7, 8A, and 8B. The power bus 408 may include a cathode bus 424 and an anode bus 426. The cathode bus 424 and anode bus 426 may be formed on or attached to the frame 302. For example, as illustrated in FIG. 4A, the cathode bus 424 and the anode bus 426 may be formed on or attached to separate vertical segments 410 of the first frame member 402 or upper frame member as illustrated in FIG. 4A. In other embodiments, the cathode bus 424 and the anode bus 426 may be formed or attached to other segments, such as horizontal segments 412 and/or to the second frame member 404 or lower frame member depending upon what may be convenient for the particular design and application of the thermoelectric generator assembly 300. For applications involving large number of TEG devices 406 and frame members and segments, separate sub-buses may be formed first, and by combining the sub-buses a system power bus or buses are formed.

Figure 4B:
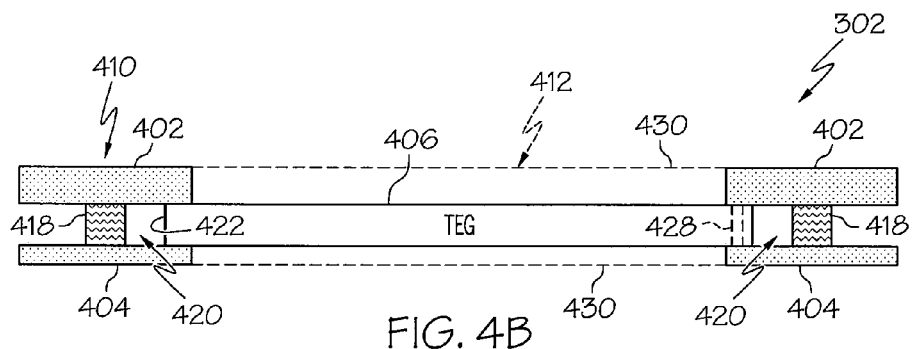
FIG. 4B is a cross-sectional view of the example of the thermoelectric generator assembly of FIG. 3 taken along lines 4-4 in accordance with another embodiment of the present disclosure.
Figure 4C:
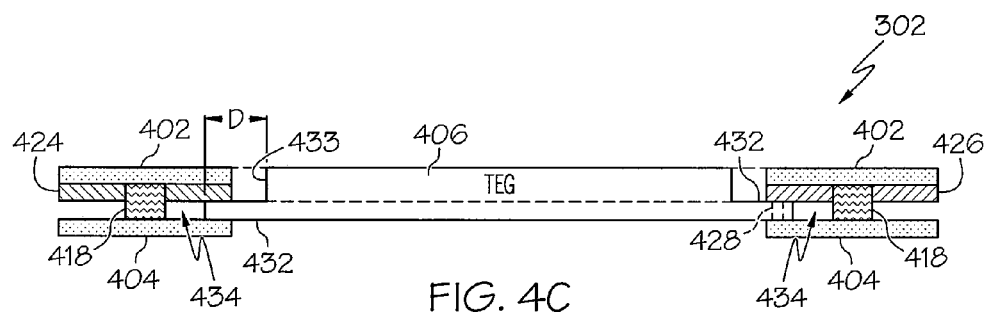
FIG. 4C is a cross-sectional view of the example of the thermoelectric generator assembly of FIG. 3 taken along lines 4-4 in accordance with an additional embodiment of the present disclosure.
Figure 4D:
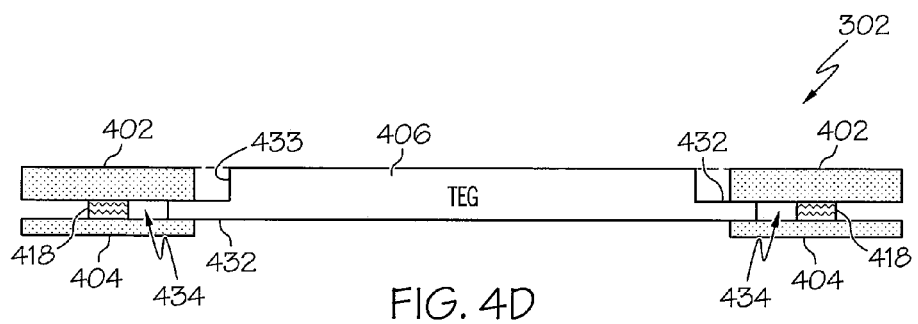
FIG. 4D is a cross-sectional view of the example of the thermoelectric generator assembly of FIG. 3 taken along lines 4-4 in accordance with a further embodiment of the present disclosure.
Figure 4E:
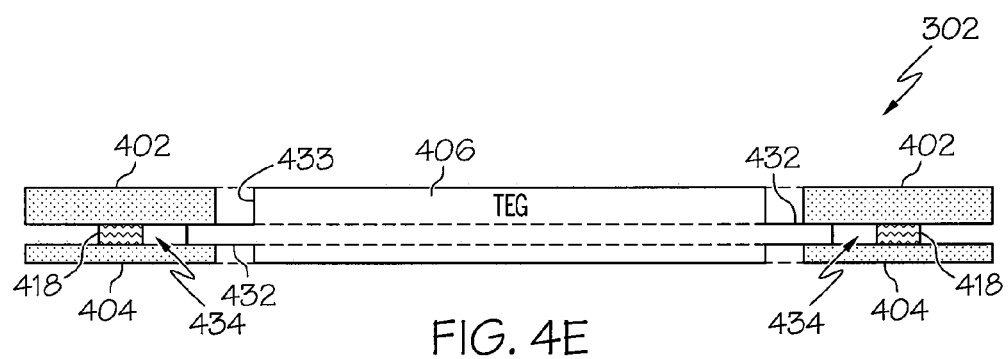
FIG. 4E is a cross-sectional view of the example of the thermoelectric generator assembly of FIG. 3 taken along lines 4-4 in accordance with another embodiment of the present disclosure.
Figure 4F:
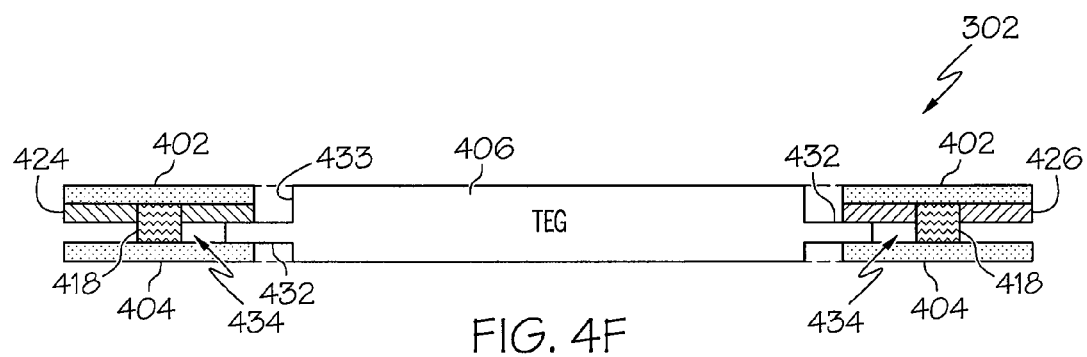
FIG. 4F is a cross-sectional view of the example of the thermoelectric generator assembly of FIG. 3 taken along lines 4-4 in accordance with a further embodiment of the present disclosure.

If the first and second frame members 402 and 404 are formed from materials that are electrically non-conductive, the cathode and anode buses 424 and 426 can be sandwiched between the first and second frame members 402 and 404 for structural support and damage protection, similar to that illustrated in FIGS. 4A, 4C, and 4F. In another embodiment, electrically conductive material, such as copper, may be used as the structural member for the frame members 402 and 404. In this embodiment, one or both of the frame members 402 and 404 may serve as electrical power conductive conduits. In this embodiment, the frame member or segments serving as the anode conductive conduit must be separated or electrically insulated or isolated from the frame member or segments serving as the cathode conductive conduits. Further, electrically conductive materials typically are also thermally conductive. Thus, thermal insulation layers are required to prevent the frame members and/or frame segments from becoming a thermal path. Electrically conductive frame members may also need to be insulated to prevent short circuit with surrounding systems or for safety concerns.

To prevent the TEG devices 406 from expanding and shrinking between the frame members 402 and 404 in random directions and result in undesirable "jamming" of the TEG devices 406 in the slip joints 420, a pin 428 may be used to hold each TEG device 406 in place. A pinned TEG device 406 may only slip freely into and out of the unconstrained three sides of the frame 302. The pin 428 may be an integral part of either the first frame member 402 or the second frame member 404 or may be a separate part. The fastener 416 may also be adapted and positioned to perform the function of the pin 428.

FIG. 4B is a cross-sectional view of the example of the thermoelectric generator assembly 300 of FIG. 3 taken along lines 4-4 in accordance with another embodiment of the present disclosure. In this embodiment, the cathode bus 424 and the anode bus 426 are not formed inside of the frame 302 and power or electrical energy generated by the TEG devices 406 may be supplied to power an external electrical device by another arrangement.

For installation and integration the TEG devices 406 in an assembly, such as assembly 300 for a given application, such as an automobile, industrial mill, or aircraft, the TEG devices 406 need to be firmly attached to the hot side, or the cold side, or both hot and cold side or sources. This may become labor intensive and error prone if each TEG device 406 needs to be placed individually. Automated means can be developed to reduce cost and human errors. However, automation can incur non-trivial capital and start-up costs. Since TEG devices generally produce larger amount of power under an application environment which offers high temperature, i.e., greater than 400° C., and large temperature differentials between hot and cold sides or sources, a high temperature attachment method such as brazing may be required. This adds cost to the system.

Once firmly attached with such techniques as brazing, individual TEG devices 406 are difficult to remove and thus may be difficult to maintain. With the frame assembly 300 described with reference to FIGS. 3 and 4B, an air gap 430 exists between the TEG device 406 and the hot or cold side surfaces or sources, as shown in FIGS. 4A and 4B. The air gap 430 may become a thermal barrier and can significantly reduce the achievable energy conversion efficiency. Even by filling the gap 430 with thermally conductive material, the resultant thermal resistance may still be higher than direct attachment or contact of the TEG device 406 to the application surface of the heat source and heat sink or cold sink.

FIG. 4C is a cross-sectional view of the example of the thermoelectric generator assembly 300 of FIG. 3 taken along lines 4-4 in accordance with an additional embodiment of the present disclosure. The TEG device 406 may include a ledge 432 extending beyond a periphery of a main body 433 of the TEG device 406. For a square or rectangular shaped TEG device, the ledge 432 may extend a predetermined distance "D" beyond the periphery of the TEG device 406 on all four sides of the device 406. As illustrated in FIG. 4C, the ledge 432 may be adapted and the distance "D" may be sufficient long to permit the ledge. 432 to be clamped between the first frame member 402 and the second frame member 404 to retain the TEG device 406 in position. The ledge 432 may be placed or formed on the top or bottom of the TEG device 406 by forming one of the end caps of the TEG device 406 larger than the other, as shown in FIGS. 4C and 4D. The ledge 432 may also be formed in the middle of the TEG device 406, as shown in FIGS. 4E and 4F. Specific placement of the ledge 432 may depend on the specific application and the need for providing direct contact between the hot side of the TEG device 406 and a heat source, direct contact between the cold side of the TEG device 406 and a heat sink or cold sink, or direct contact by both the hot and cold sides of the TEG device 406 respectively to the heat source and cold sink or heat sink. The ledge 432 permits the air gap 430 in FIGS. 4A and 4B to be significantly reduced or eliminated. By reducing or eliminating the air gap 430, thermal resistance is reduced and energy conversion efficiency is increased.

As described in more detail with reference to FIGS. 7, 8A and 8B, electrical contacts may be formed on the ledge 432 for contacting the power buses 424 and 426. The power buses 424 and 426 may have different configurations depending upon the design or configuration of the TEG devices 406 and the application of the thermoelectric generator assembly 300.

A slip joint 434 may be formed by the first and second frame members 402 and 404, the ledge 432 and the spacer 418. The slip joint 434 is adapted to permit the TEG device 406 and the frame 302 to expand and contract when exposed to varying temperature levels or when the TEG device 406 and the frame 302 have different coefficients of thermal expansion. When the TEG device 406 expands the ledge 432 may fill more of the space between an end of the ledge 432 and the spacer 418. This will reduce thermal stress in the frame 302 and each TEG device 406.

A TEG device 406 with a ledge 432 may be slightly more difficult to manufacture than a square or rectangular TEG device without a ledge. However, the ledged TEG device offers significant advantages. The ledge 432 may be integrally formed with the TEG device 406 or may be a separate component. Any mismatch in thermal resistance may be avoided by integrally forming the ledge 432 with the TEG device 406. One advantage of the ledge 432 is that the ledge 432 provides a slot to set the TEG device 406 during assembly into the frame 302. The frame 302 filled with TEG devices 406 may be first built in a factory production line. The entire sub-assembly may then be installed into a product at a final assembly site. This approach may significantly simplify system integration and installation operations and reduce human error involved in installing individual TEG devices.

Another advantage of the ledged TEG device is that the ledge 432 is constrained within the opening of the first and second frame members 402 and 404, as illustrated in FIGS. 4C-4F. This allows very little movement due to thermal expansion and vibration, and achieves tighter tolerance during manufacturing and in service.

Another advantage with the ledge 432 in the frame 302 is that the frame 302 and TEG device 406 may be attached directly to either a hot or cold surface or both surfaces without an air gap or gaps 430, as illustrated in FIGS. 4A and 4B with pressure using the fasteners 416. Direct contact of the TEG device 406 to either the hot or cold surfaces or both will help to achieve a maximum system level thermal-electric power generation.

As previously discussed, by mounting the TEG devices 406 in the frame 302, the TEG devices 406 do not need to be permanently attached to the heat transfer surfaces with such means as brazing or other attachment means, and the TEG devices 406 are removable. Maintenance and service tasks are thus dramatically simplified. Further, the system performance can be easily upgraded with advancement of TEG device performance by replacing only TEG devices 406 in the frame 302.

FIG. 4D is a cross-sectional view of the example of the thermoelectric generator assembly 300 of FIG. 3 taken along lines 4-4 in accordance with a further embodiment of the present disclosure. FIG. 4D is similar to FIG. 4C except the cathode and anode buses 424 and 426 are formed at a different location than an interior of frame 302.

FIG. 4E is a cross-sectional view of the example of the thermoelectric generator assembly 300 of FIG. 3 taken along lines 4-4 in accordance with another embodiment of the present disclosure. As previously discussed FIG. 3 illustrates the embodiment of the ledge 432 being formed or located at an intermediate location along the side edge of the TEG device 406.

FIG. 4F is a cross-sectional view of the example of the thermoelectric generator assembly 300 of FIG. 3 taken along lines 4-4 in accordance with a further embodiment of the present disclosure. FIG. 4F is similar to the embodiment in FIG. 4E except the cathode and anode buses 424 and 426 are at a different location from on the inside of the fame 302 or specifically on the inside of the first frame member 402.

Similar to that previously described, the thermoelectric generator assembly 300 may be mounted within a gas turbine engine, aircraft engine, industrial mill, automobile or other apparatus where the hot side of each TEG device 406 may be thermally coupled or connected to a heat source and the cold side of each TEG device 406 may be thermally coupled or connected to a heat sink or cold sink. For example, the thermoelectric generator assembly 300 or a plurality of thermoelectric generator assemblies similar to assembly 300 may mounted or attached within a gas turbine engine or aircraft engine similar to that described in U.S. patent application Ser. No. 12/050,849, filed Mar. 18, 2008, entitled "Thermoelectric Generation System" and assigned to the same assignee as the present application. In such applications, the thermoelectric generator assembly 300 may be shaped to conform substantially to the interior of the engine or other apparatus in which the assembly 300 may be mounted or attached. To maximize packing density and energy conversion efficiency, the closer the thermoelectric generator assembly 300 or assemblies and TEG devices 406 mounted therein match the surface curvature of the engine or apparatus, the better the installation. In other words, installing the smaller TEG device 406 in mounted in thermoelectric generator assemblies 300 incurs less curvature effect when compared to larger TEG modules and TEG devices.

The TEG device 406 may also have different contact arrangement as illustrated in FIGS. 5A, 5B, 6A, 6B, 7, 8A and 8B. The layout of the power buses in the thermoelectric generator assembly and the contact arrangement of the TEG devices 406 may be configured and coordinated to provide the most efficient means for transferring the electrical energy or power from each of the TEG devices 406 in the assembly to an electrical or electronic device being powered by the thermoelectric generator assembly similar to that illustrated in FIG. 9.

Figure 5A:
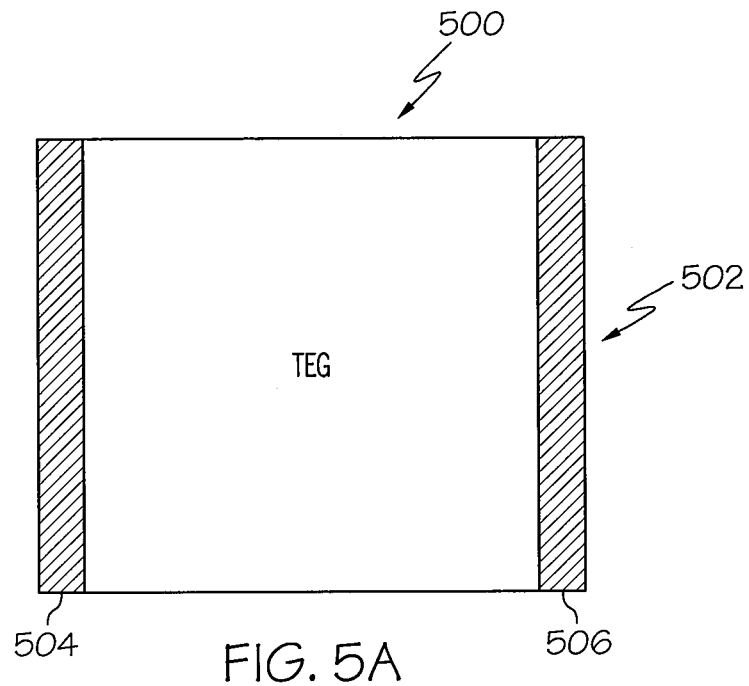
FIG. 5A is a top view of an example of a thermoelectric generator device and electrical contact arrangement in accordance with an embodiment of the present disclosure.

FIG. 5A is a top view of an example of a TEG device 500 and electrical contact arrangement 502 in accordance with an embodiment of the present disclosure. The TEG device 500 may be used for the TEG devices 406 in FIGS. 3 and 4A-4F. The electrical contact arrangement 502 may include a cathode contact 504 and an anode contact 506. The contacts 504 and 506 may be built into opposite ends of the TEG device 500 or depending upon the application may be built into adjacent ends or sides of the TEG device 500. The cathode contact 504 and the anode contact 506 may extend substantially the entire length of the ends of the TEG device 500.

Figure 5B:
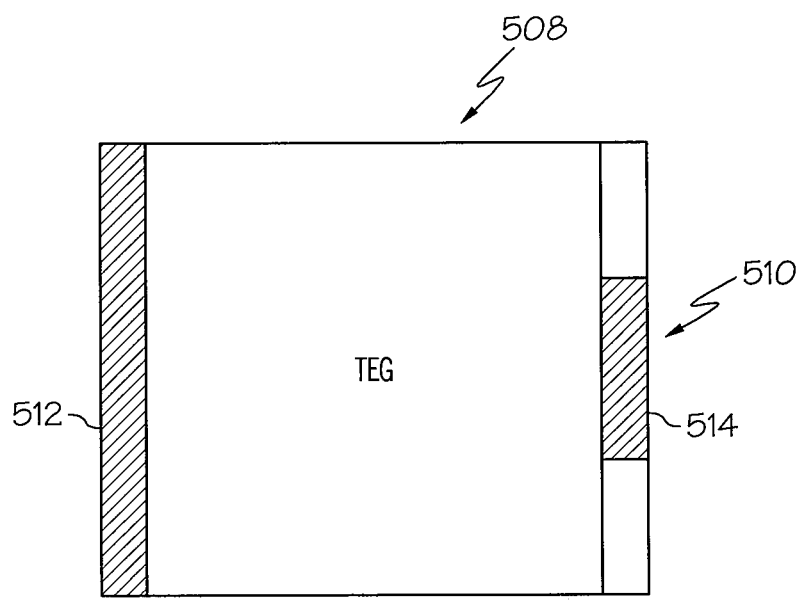
FIG. 5B is a top view of an example of a thermoelectric generator device and electrical contact arrangement in accordance with another embodiment of the present disclosure.

FIG. 5B is a top view of an example of a TEG device 508 and electrical contact arrangement 510 in accordance with another embodiment of the present disclosure. The TEG device 508 may be used for the TEG devices 406 in FIGS. 3 and 4A-4F. The TEG device 508 may be the same or similar to the TEG device 500 in FIG. 5A except the contacts may not extend the entire length of the sides of the TEG device 508 as illustrated in FIG. 5B. In the exemplary TEG device 508 shown in FIG. 5B, a cathode contact 512 may extend the entire length of a side or end of the TEG device 508 and define a full length power connector. An anode contact 514 may extend partially along another side or end of the TEG device 508 and may define a part or partial length power connector. In another embodiment, the cathode contact 512 may be a part or partial length power contact and the anode contact 514 may be a full length power contact. In a further embodiment, both contacts 512 and 514 may be part or partial length power connectors. The partial length power contacts 512 or 514 may also be formed at a selected position along the side of the TEG device 508 depending upon a particular design and/or application of the thermoelectric generator assembly in which the TEG device 508 is mounted and connection to a power bus or buses.

Figure 6A:
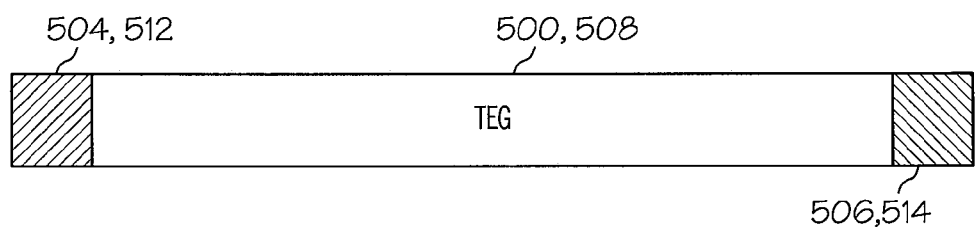
FIG. 6A is a side elevation view of the thermoelectric generator device and electrical contact arrangement of either FIG. 5A or 5B in accordance with an embodiment of the present disclosure.

FIG. 6A is a side elevation view of the thermoelectric generator device 500 or 508 and electrical contact arrangement 502 or 510 of either FIG. 5A or 5B in accordance with an embodiment of the present disclosure. FIG. 6A illustrates the cathode contact 504 or 512 and the anode contact 506 and 514 extend substantially completely across the ends of the TEG device 500 or 508. In other embodiments the cathode contact 504 or 512 and the anode contact 506 and 514 may extend only partially across the respective ends of the TEG device 500 or 508 similar to that illustrated in FIG. 6B.

Figure 6B:
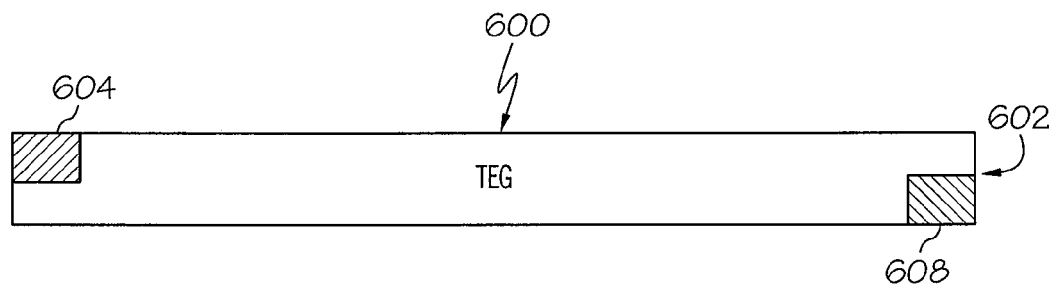
FIG. 6B is a side elevation view of a thermoelectric generator device and electrical contact arrangement in accordance with another embodiment of the present disclosure.

FIG. 6B is a side elevation view of a thermoelectric generator device 600 and electrical contact arrangement 602 in accordance with another embodiment of the present disclosure. FIG. 6B illustrates a cathode contact 604 and an anode contact 608 that respectively extend partially across the ends of the TEG device 600. The cathode contact 604 and anode contact 608 may be positioned at selected locations along the ends of the TEG device 600 depending upon the possible design and application of the TEG device 600 and the thermoelectric generator assembly in which the TEG device 600 may be mounted for use. The cathode contact 604 and the anode contact 608 may extend substantially completely along the side or end of the TEG device 600 similar to that illustrated in FIG. 5A or may extend partially along the side or end of the TEG device 600 similar to the anode contact 514 illustrated in FIG. 5B.

Figure 7:
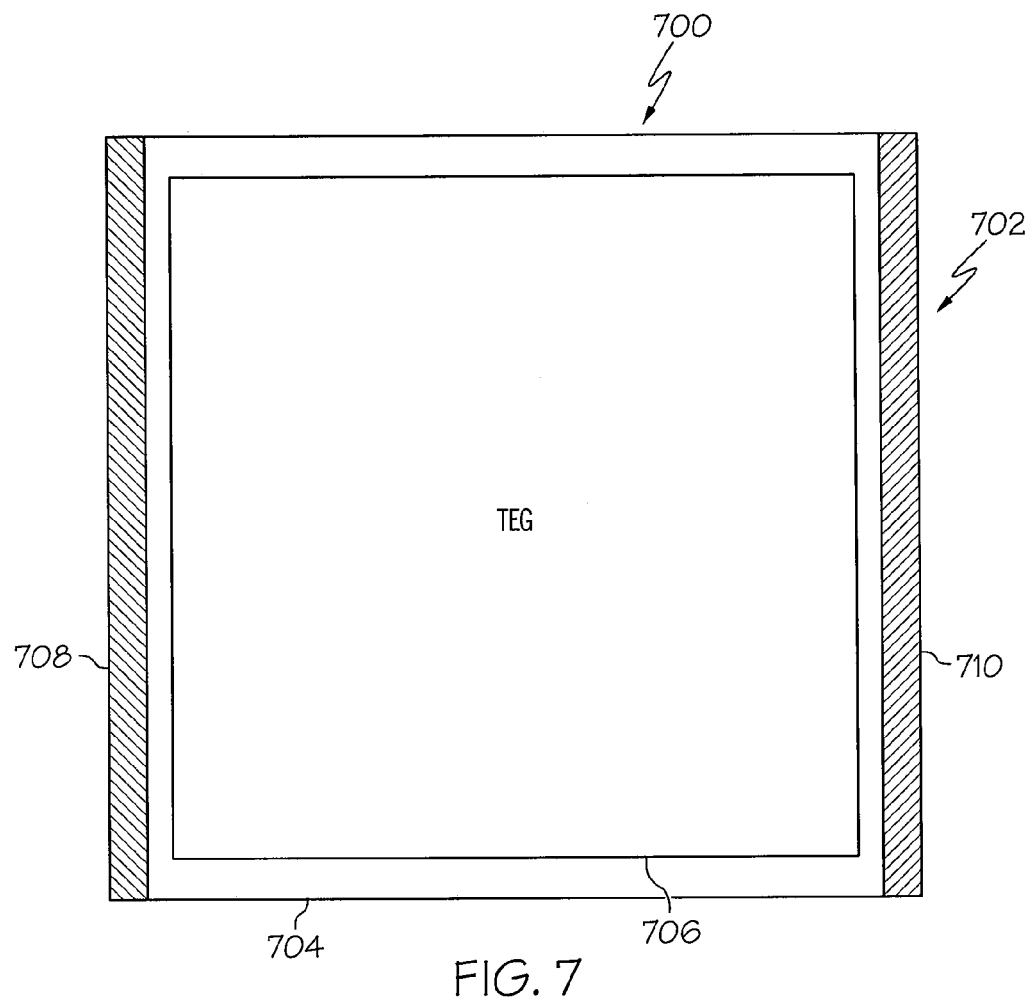
FIG. 7 is a top view of an example of a thermoelectric generator device and electrical contact arrangement in accordance with an embodiment of the present disclosure.

FIG. 7 is a top view of an example of a thermoelectric generator device (TEG) 700 and electrical contact arrangement 702 in accordance with an embodiment of the present disclosure. The thermoelectric device 700 may be used for the thermoelectric devices 406 in FIGS. 3 and 4A-4F. The TEG device 700 may include a ledge 704 extending beyond the periphery 706 or main body of the TEG device 700. The ledge 704 may extend beyond each side or end of the TEG device 700 or may extend beyond the main body substantially completely around a perimeter of the TEG device. In other embodiments, the ledge 704 may extend beyond only selected sides or ends of the TEG device 700 depending upon the design and application of the TEG device and the design and application of the thermoelectric generator assembly, similar to assembly 300 in FIG. 3, in which the TEG device 700 may be mounted. The contact arrangement 702 may be formed on or attached to the ledge 704 on selected sides of the TEG device 700. A cathode contact 708 may be formed or attached to the ledge 704 on one side of the TEG device 700 and an anode contact 710 may be formed or attached to the ledge 704 on an opposite side of the TEG device 700. In another embodiment, the cathode contact 708 and the anode contact 710 may be formed or attached on adjacent sides of the TEG device 700. The cathode contact 708 and the anode contact 710 may extend substantially the entire length of the respective sides of the TEG device 700 similar to that illustrated in FIG. 7 or may extend only part of the length of the respective sides of the TEG device 700 similar to the cathode and anode contacts 512 and 514 shown in FIG. 5B.

Figure 8A:
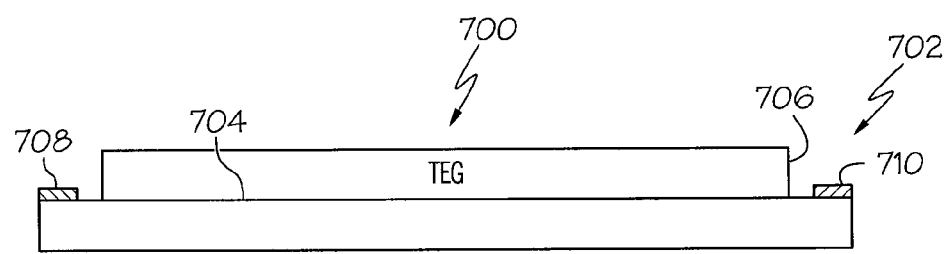
FIG. 8A is a side elevation view of the thermoelectric generator device and electrical contact arrangement of FIG. 7 in accordance with an embodiment of the present disclosure.

FIG. 8A is a side elevation view of the thermoelectric generator device 700 and electrical contact arrangement 702 of FIG. 7 in accordance with an embodiment of the present disclosure. In other embodiments, the cathode contact 708 and the anode contact 710 may be formed or attached on the underside of the ledge 704 from that shown in FIG. 8A. In further embodiments, one contact may be formed on one side of the ledge 704 and the other contact may be formed or attached on the opposite side of the ledge 704 depending upon the design and application of the TEG device 700 and the thermoelectric generator assembly in which the device 700 may be used and how the buses of the assembly with contact the TEG devices 700.

Figure 8B:
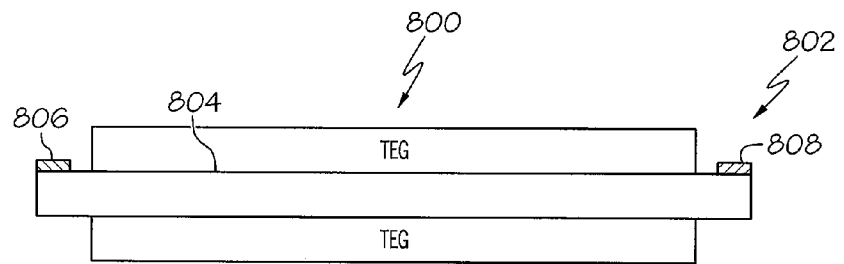
FIG. 8B is a side elevation view of a thermoelectric generator device and electrical contact arrangement in accordance with an embodiment of the present disclosure.

FIG. 8B is a side elevation view of a thermoelectric generator (TEG) device 800 and electrical contact arrangement 802 in accordance with another embodiment of the disclosure. The TEG device 800 may be similar to the TEG device 700 in FIG. 7 except the ledge 804 may be formed at an intermediate position along a side edge of the TEG device 800 similar to the TEG devices 406 described with reference to FIGS. 4E and 4F. A cathode contact 806 and an anode contact 808 may be formed on an upper side of the ledge 804 similar to that illustrated in FIG. 8B. In other embodiments, the cathode contact 806 and the anode contact 808 may each be formed on an under side of the ledge 804 from that shown in FIG. 8B or on opposite sides of the ledge 804 depending upon the application and how the buses are designed to contact each of the TEG devices in a thermoelectric generator assembly.

Figure 9:
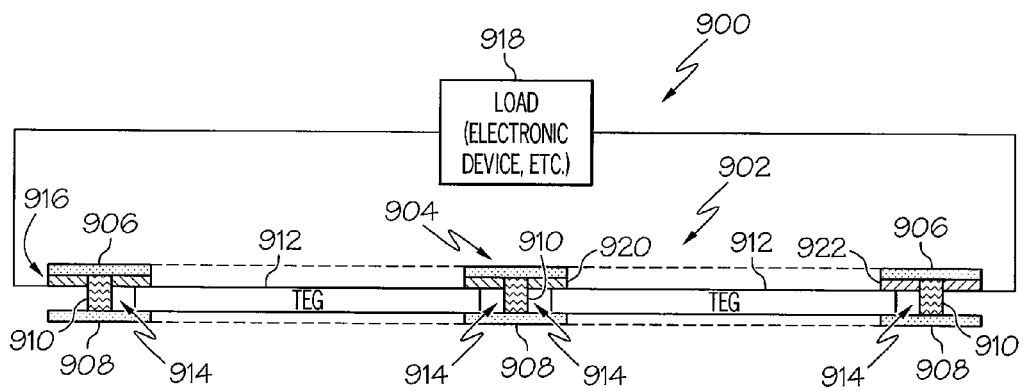
FIG. 9 is a block schematic diagram of an exemplary thermoelectric generator system in accordance with an embodiment of the present disclosure.

FIG. 9 is a block schematic diagram of an exemplary thermoelectric generator (TEG) system 900 in accordance with an embodiment of the present disclosure. The TEG system 900 may include a TEG assembly 902. The TEG assembly 902 may be similar to the TEG assembly 300 in FIG. 3. Accordingly, the TEG assembly 902 may include a frame 904. The frame 904 may include a first frame member 906 and a second frame member 908. A spacer 910 may be disposed between the first and second frame member 906 and 908. A plurality of TEG devices 912 may be mounted in the frame 904 and clamped between the first and second frame members 906 and 908. A slip joint 914 may be formed by the first and second frame members 906 and 908, a side edge of each of the TEG devices 912 and the spacer 910. Similar to that previously described, the slip joint is adapted to permit the TEG devices 912 and the frame 904 to expand and contract when exposed to varying temperature levels or when the TEG devices 912 and the frame 904 have different coefficients of thermal expansion.

The TEG assembly 902 may also include a power bus 916 to provide the electrical energy or power generated by the TEG devices 912 for powering an electrical or electronic device 918. The power bus 916 may include a cathode bus 920 and an anode bus 922. The cathode bus 920 and the anode bus 922 may have a configuration similar to that previously described with reference to any of FIGS. 5A, 5B, 6A, 6B, 7, 8A and 8B.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the embodiments herein have other applications in other environments. This application is intended to cover any adaptations or variations of the present disclosure. The following claims are in no way intended to limit the scope of the disclosure to the specific embodiments described herein.

What is claimed is:

1. A thermoelectric generator assembly, comprising:
a frame comprising a first frame member and a second frame member, wherein the first frame member and the second frame member each comprise a same shape, are disposed parallel with one another and aligned with one another, and the first frame member and the second frame member are fastened together to retain one or more thermoelectric generator devices in position between the first frame member and the second frame member for transferring heat energy by the one or more thermoelectric generator devices from a heat source to a heat sink to generate electrical energy and wherein the first frame member and the second frame member each comprise a plurality of fastener holes that each respectively receive a fastener to directly attach the first frame member to the second frame member;
a spacer positioned between the first frame member and the second frame member;
a single ledge extending outwardly from a periphery of a main body of each of the one or more thermoelectric generator devices, wherein the single ledge comprises a ledge portion including a thickness that is smaller than a thickness of the main body of the one or more thermoelectric generator devices from which the single ledge extends, the ledge portion being is gripped between the first frame member and the second frame member to retain the one or more thermoelectric generator devices in position and the frame comprises a lattice structure and openings that expose a cold side and a hot side of the one or more thermoelectric generator devices for contacting a heat source and a heat sink respectively; and a power bus to provide the electrical energy generated by the one or more thermoelectric generator devices for powering an electrical device.

2. The thermoelectric generator assembly of claim 1, further comprising a slip joint formed by the first and second frame members, the ledge and the spacer, wherein the slip joint is adapted to permit the one or more thermoelectric generator devices and the frame to expand and contract when exposed to varying temperature levels or when the thermoelectric generator devices and the frame have different coefficients of thermal expansion.

3. The thermoelectric generator assembly of claim 1, wherein the ledge is formed to permit at least one of a hot side of each of the one or more thermoelectric generator devices to contact the heat source, or a cold side of each of the one or more thermoelectric generator devices to contact the heat sink, or both the hot side and the cold side of each of the one or more thermoelectric generator devices respectively contacting the heat source and the heat sink.

4. The thermoelectric generator assembly of claim 1, further comprising a slip joint formed by the first and second frame members, a side edge of the ledge portion and the spacer, wherein the slip joint is adapted to permit the one or more thermoelectric generator devices and the frame to expand and contract when exposed to varying temperature levels or when the thermoelectric generator devices and the frame have different coefficients of thermal expansion.

5. The thermoelectric generator assembly of claim 1, wherein the spacer has a predetermined thickness to maintain a tight but movable slip joint over an operating temperature range of the one or more thermoelectric generator devices and to provide a predetermined space for expansion of the thermoelectric generator device with the frame without creating any parasitic thermal paths between the heat source and the heat sink or the cold side.

6. The thermoelectric generator assembly of claim 1, wherein the spacer is a separate component from the frame to permit the frame to be used with other thermoelectric generator devices having different thicknesses.

7. The thermoelectric generator assembly of claim 1, wherein the spacer is integrally formed with one of the first and second frame members.

8. The thermoelectric generator assembly of claim 1, wherein the first and second frame members are formed from a material that is a thermally and electrically insulating material.

9. The thermoelectric generator assembly of claim 1, each of the one or more thermoelectric generator devices is square or rectangular and wherein the thermoelectric generator assembly further comprises a fastener to attach the first frame member to the second frame member proximate to each corner of the one or more thermoelectric generator devices.

10. The thermoelectric generator assembly of claim 9, wherein the fastener is removable for maintaining and replacing the one or more thermoelectric generator devices, and wherein the fastener is adapted to secure the frame to one of a surface of the heat source and a heat sink.

11. The thermoelectric generator assembly of claim 1, wherein the power bus comprises a cathode bus interconnected to a cathode contact of each of the one or more thermoelectric generator devices and an anode bus interconnected to an anode contact of each of the thermoelectric generator devices.

12. The thermoelectric generator assembly of claim 11, wherein the cathode bus and the anode bus are each formed on an interior portion of the frame.

13. The thermoelectric generator assembly of claim 11, wherein the cathode contact and the anode contact are formed on each of thermoelectric generator devices in a predetermined configuration to facilitate interconnection to the cathode bus and the anode bus.

14. The thermoelectric generator assembly of claim 1, wherein the thermoelectric generator assembly is mountable in an aircraft engine.

15. A thermoelectric generator assembly, comprising:
a thermoelectric generator device;
a frame adapted to hold the thermoelectric generator device; and
the thermoelectric generator device comprising a main body and a single ledge, the single ledge extending outwardly from a periphery of the main body of the thermoelectric generator device, wherein the single ledge comprises a ledge portion including a thickness that is smaller than a thickness of the main body, the ledge portion being adapted for mounting the thermoelectric generator device in the frame, the frame only contacting the ledge portion and the frame comprising openings exposing a hot side and a cold side of the thermoelectric generator device.

16. The thermoelectric generator of claim 15, wherein the frame comprises a first frame member and a second frame member, the first frame member and the second frame member each comprising a same shape, are disposed parallel with one another and aligned with one another and are adapted to clamp the ledge therebetween to retain the thermoelectric generator device in position for transferring heat energy through the thermoelectric generator device from a heat source to a heat sink to generate electrical energy.

17. The thermoelectric generator assembly of claim 15, further comprising a spacer positioned between the first frame member and the second frame member.

18. The thermoelectric generator assembly of claim 17, further comprising a slip joint formed by the first and second frame members, the ledge and the spacer, wherein the slip joint is adapted to permit the one or more thermoelectric generator devices and the frame to expand and contract when exposed to varying temperature levels or when the thermoelectric generator devices and the frame have different coefficients of thermal expansion.

19. A thermoelectric generator assembly, comprising:
a thermoelectric generator device comprising a plurality of sides;
a frame adapted to hold the thermoelectric generator device, the frame contacting and gripping only a portion of the thermoelectric generator device proximate each of the plurality of sides and the frame comprising a lattice structure and openings exposing a hot side and a cold side of the thermoelectric generator device; and
a slip joint formed to permit the thermoelectric generator device and the frame to expand and contract when exposed to varying temperature levels or when the thermoelectric generator device and the frame have different coefficients of thermal expansion; and a pin through the thermoelectric generator device that prevents the thermoelectric generator device from expanding and contracting in the frame causing jamming of the thermoelectric generator device in the slip joint.

20. The thermoelectric generator of claim 19, wherein the frame comprises a first frame member and a second frame member, the first frame member and the second frame member being adapted to retain the thermoelectric generator device in position between the first frame member and the second frame member for transferring heat energy through the thermoelectric generator device from a heat source to a heat sink to generate electrical energy.

21. A thermoelectric generator device, comprising:
a main body;
a single ledge integral with the main body and extending a predetermined distance outwardly from a periphery of the main body of the thermoelectric generator device, wherein the single ledge comprises a ledge portion including a thickness that is smaller than a thickness of the main body frame which the single ledge extends, the ledge portion being adapted for being gripped by a frame to hold the thermoelectric generator device in position in the frame, the frame comprising a lattice structure and an opening for exposing a cold side and a hot side of the thermoelectric generator device, the cold side being thermally coupleable to a heat source and the hot side being thermally coupleable to a heat sink.

22. The thermoelectric generator device of claim 21, wherein the ledge extends beyond the periphery of the main body substantially completely around a perimeter of the main body of the thermoelectric generator device.

23. The thermoelectric generator device of claim 21, wherein the ledge extends beyond selected sides of the thermoelectric generator device.

24. The thermoelectric generator device of claim 21, wherein the ledge extends from an intermediate location along a side edge of the main body between the hot side and the cold side of the thermoelectric generator device.

25. The thermoelectric generator device of claim 21, wherein an electrical contact arrangement is formed on the ledge for supplying electrical energy generable by the thermoelectric generator device.

26. The thermoelectric generator assembly of claim 1, wherein the fastener holes in at least one of the first frame member or the second frame member are enlarged or slotted for thermal stress relief.

27. The thermoelectric generator assembly of claim 1, further comprising a pin extending through the ledge on one side of each of the one or thermoelectric generator devices that holds the thermoelectric generator device in place during thermal expansion and contraction.

28. The thermoelectric generator assembly of claim 27, wherein the pin is an integral part of one of the first frame member or the second frame member.

\* \* \* \* \*

UNITED STATES PATENT AND TRADEMARK OFFICE
CERTIFICATE OF CORRECTION

PATENT NO. : 9,112,109 B2  
APPLICATION NO. : 12/613897  
DATED : August 18, 2015  
INVENTOR(S) : David W. Kwok et al.

Page 1 of 1

It is certified that error appears in the above-identified patent and that said Letters Patent is hereby corrected as shown below:

IN THE CLAIMS:

In column 15, line 22, claim 21, please change line 22 to:

"the main body from which the single ledge extends, the"

Signed and Sealed this  
Ninth Day of February, 2016

Michelle K. Lee  
*Director of the United States Patent and Trademark Office*